(12) United States Patent
Lee

(10) Patent No.: US 10,964,392 B2
(45) Date of Patent: Mar. 30, 2021

(54) MEMORY SYSTEM PERFORMING CACHE PROGRAM AND OPERATING METHOD THEREOF

(71) Applicant: SK hynix Inc., Gyeonggi-do (KR)

(72) Inventor: Joo-Young Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/504,023

(22) Filed: Jul. 5, 2019

(65) Prior Publication Data
US 2020/0066348 A1 Feb. 27, 2020

(30) Foreign Application Priority Data
Aug. 27, 2018 (KR) .................. 10-2018-0100119

(51) Int. Cl.
| | | |
|---|---|---|
| *G11C 16/10* | (2006.01) | |
| *G11C 16/26* | (2006.01) | |
| *G06F 13/16* | (2006.01) | |
| *G06F 12/0815* | (2016.01) | |

(52) U.S. Cl.
CPC .......... *G11C 16/10* (2013.01); *G06F 12/0815* (2013.01); *G06F 13/1668* (2013.01); *G11C 16/26* (2013.01)

(58) Field of Classification Search
CPC ....... G11C 16/10; G11C 16/26; G11C 7/1063; G11C 16/0483; G11C 2211/5641; G11C 5/02; G06F 13/1668; G06F 12/0815; G06F 12/0877; G06F 12/0873
See application file for complete search history.

(56) References Cited

U.S. PATENT DOCUMENTS

| | | | | |
|---|---|---|---|---|
| 7,463,521 B2* | 12/2008 | Li | .................. | G06F 12/0893 365/185.03 |
| 7,577,037 B2* | 8/2009 | Li | .................. | G06F 12/0893 365/185.22 |
| 7,652,918 B2* | 1/2010 | Wan | .................. | G11C 16/10 365/185.03 |
| 2013/0138884 A1* | 5/2013 | Kawamura | ........ | G06F 12/0866 711/119 |
| 2013/0198437 A1* | 8/2013 | Omizo | .............. | G06F 12/0246 711/103 |

FOREIGN PATENT DOCUMENTS

| | | |
|---|---|---|
| KR | 10-1165429 | 7/2012 |
| KR | 10-1212739 | 12/2012 |

\* cited by examiner

*Primary Examiner* — Gene N Auduong
(74) *Attorney, Agent, or Firm* — IP & T Group LLP

(57) ABSTRACT

A memory system includes a controller suitable for providing first data, a cache program command corresponding to the first data, second data, and a normal program command corresponding to the second data; and a memory device suitable for programming the first data to a target die according to the cache program command, setting the target die to a normal state after the program operation for the first data is completed, and programming the second data to the target die according to the normal program command.

24 Claims, 16 Drawing Sheets

MEMORY SYSTEM PERFORMING CACHE PROGRAM AND OPERATING METHOD THEREOF

CROSS-REFERENCE TO RELATED APPLICATION

This application claims priority under 35 U.S.C. § 119 to Korean Patent Application No. 10-2018-0100119 filed on Aug. 27, 2018, which is incorporated herein by reference in its entirety.

BACKGROUND

1. Field

Exemplary embodiments relate to a memory system and an operating method thereof, and more particularly, to a memory system capable of efficiently performing a cache program operation, and an operating method thereof.

2. Discussion of the Related Art

The computer environment paradigm has shifted to ubiquitous computing, which enables computing systems to be used anytime and anywhere. As a result, use of portable electronic devices such as mobile phones, digital cameras, and laptop computers has rapidly increased. These portable electronic devices generally use a memory system having one or more memory devices for storing data. A memory system may be used as a main memory device or an auxiliary memory device of a portable electronic device.

Memory systems provide excellent stability, durability, high information access speed, and low power consumption, since they have no moving parts, as compared with a hard disk device. Examples of memory systems having such advantages include universal serial bus (USB) memory devices, memory cards having various interfaces, and solid state drives (SSD).

SUMMARY

Various embodiments are directed to a memory system capable of efficiently performing a cache program operation, and an operating method thereof.

In accordance with an embodiment of the present invention, a memory system which processes a cache program command and a normal program command, the memory system includes: a controller suitable for providing first data, the cache program command corresponding to the first data, second data, and the normal program command corresponding to the second data; and a memory device suitable for programming the first data to a target die according to the cache program command, setting the target die to a normal state after the program operation for the first data is completed, and programming the second data to the target die according to the normal program command.

In accordance with an embodiment of the present invention, an operating method for a memory system which processes a cache program command and a normal program command, the operating method includes: providing, by a controller, a memory device with first data and the cache program command corresponding to the first data; programming the first data to a target die according to the cache program command; setting the target die to a normal state; providing, by the controller, the memory device with second data and the normal program command corresponding to the second data; and programming the second data to the target die according to the normal program command.

In accordance with an embodiment of the present invention, a memory system includes: a memory device; and a controller configured to control the memory device to perform a normal program operation after completion of a cache program operation when the normal program operation is requested during the cache program operation, wherein the memory device automatically becomes ready for the normal program operation upon completion of the cache program operation.

DETAILED DESCRIPTION

Figure 1:
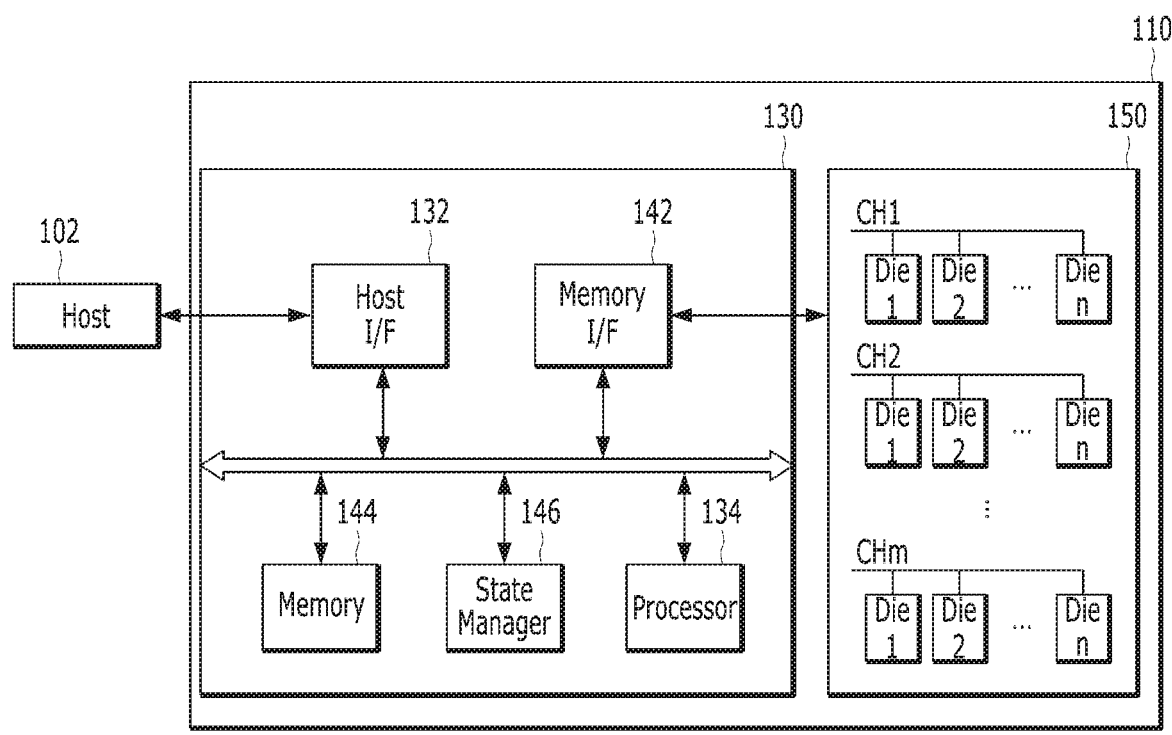
FIG. 1A is a block diagram illustrating a data processing system including a memory system in accordance with an embodiment of the present disclosure.
FIG. 1B is a diagram illustrating a state management table in accordance with an embodiment.

Various embodiments of the disclosure are described below in more detail with reference to the accompanying drawings. However, elements and features of the present invention may be configured or arranged to form other embodiments, which may be modifications or variations of any of the disclosed embodiments. Thus, the present invention is not limited to the embodiments set forth herein. Rather, the described embodiments are provided so that this disclosure is thorough and complete, and fully conveys the present invention to those skilled in the art to which this invention pertains. Throughout the disclosure, like reference numerals refer to like parts throughout the various figures and examples of the disclosure. It is noted that reference to "an embodiment" or the like does not necessarily mean only one embodiment, and different references to any such phrase are not necessarily to the same embodiment(s).

It will be understood that, although the terms "first", "second", "third", and so on may be used herein to identify various elements, these elements are not limited by these terms. These terms are used to distinguish one element from another element that otherwise have the same or similar names. Thus, a first element in one instance may be termed a second or third element in another instance without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Whether two elements are directly or indirectly connected/coupled, communication between the two elements may be wired or wireless, unless stated or the context indicates otherwise.

The terminology used herein is for the purpose of describing particular embodiments and is not intended to be limiting of the present invention.

As used herein, singular forms are intended to include the plural forms and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art, and not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1A is a block diagram illustrating a data processing system 100 in accordance with an embodiment of the present invention.

Referring to FIG. 1A, the data processing system 100 may include a host 102 operatively coupled to a memory system 110.

The host 102 may include, for example, any of a variety of portable electronic devices such as a mobile phone, an MP3 player and a laptop computer or an electronic device such as a desktop computer, a game player, a television (TV), a projector, and the like.

The memory system 110 may operate or perform a specific function or operation in response to a request from the host 102 and, particularly, may store data to be accessed by the host 102. The memory system 110 may be used as a main memory system or an auxiliary memory system of the host 102. The memory system 110 may be implemented with any one of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device such as a dynamic random access memory (DRAM) and/or a static RAM (SRAM), and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM), and/or a flash memory.

The memory system 110 may include a controller 130 and a memory device 150. The memory device 150 may store data to be accessed by the host 102. The controller 130 may control storage of data in the memory device 150.

The controller 130 and the memory device 150 may be integrated into a single semiconductor device, which may be included in any of the various types of memory systems as exemplified above.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device that retains data stored therein even while an electrical power is not supplied. The memory device 150 may store data provided from the host 102 through a write operation, and provide data stored therein to the host 102 through a read operation.

The memory device 150 may include a plurality of dies coupled to each of a plurality of channels. Each of the dies may include a plurality of memory blocks. Each of the memory blocks may include a plurality of pages. Each of a plurality of pages may include a plurality of memory cells coupled to a word line. In an embodiment, the memory device 150 may be a flash memory having a 3-dimensional (3D) stack structure.

The structure of the memory device 150 including a three-dimensional stack structure thereof will be described later in more detail with reference to FIGS. 2 to 4.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program, and erase operations of the memory device 150.

Specifically, the controller 130 may include a host interface (I/F) 132, a processor 134, a memory I/F 142, a memory 144 and a state manager 146.

The host interface 132 may process a command and data of the host 102. The host interface 132 may communicate with the host 102 through one or more of various interface protocols such as universal serial bus (USB), multi-media card (MMC), peripheral component interconnect-express (PCI-e or PCIe), small computer system interface (SCSI), serial-attached SCSI (SAS), serial advanced technology attachment (SATA), parallel advanced technology attachment (PATA), enhanced small disk interface (ESDI) and integrated drive electronics (IDE). The host interface 132 may be driven via firmware, that is, a host interface layer (HIL) for exchanging data with the host 102.

The memory interface 142 may serve as a memory/storage interface between the controller 130 and the memory device 150 such that the controller 130 may control the memory device 150 in response to a request from the host 102.

The memory 144 may serve as a working memory of the memory system 110 and the controller 130, and store data for driving the memory system 110 and the controller 130.

The memory 144 may be a volatile memory. For example, the memory 144 may be a static random access memory (SRAM) or dynamic random access memory (DRAM). The memory 144 may be disposed within or external to the controller 130. FIG. 1 shows the memory 144 disposed within the controller 130. In an embodiment, the memory 144 may be an external volatile memory having a memory interface for transferring data between the memory 144 and the controller 130.

As described above, the memory 144 may store some data required to perform data write and read operations between the host 102 and the memory device 150, and other data required for the controller 130 and the memory device 150 to perform these operations. The memory 144 in accordance with the present embodiment may temporarily store write data provided from the host 102. For example, when the host 102 provides a write command to the memory system 110, the memory 144 may temporarily store write data corresponding to the write command provided from the host 102 under control of the processor 134. The memory 144 may include a program memory, a data memory, a write buffer/cache, a read buffer/cache, a data buffer/cache and a map buffer/cache.

The processor 134 may control overall operations of the memory system 110 and program or read operations of the memory device 150 in response to write request or read request of host 102.

In order to control overall operations of the memory system 110, the processor 134 may use firmware to control the overall operations of the memory system 110. The firmware may be referred to as flash translation layer (FTL). The processor 134 may be implemented with a microprocessor or a central processing unit (CPU).

Therefore, the processor 134 may drive the firmware to map a logical address corresponding to write data provided from the host 102 to a physical address indicating a position in which the write data is to be actually stored.

The processor 134 may control the memory device 150 to program the write data temporarily stored in the memory 144 to the physical address corresponding to the write data.

Specifically, the processor 134 may provide a program command and the write data to the memory device 150 in order to program the write data to the memory device 150. In particular, the processor 134 may provide a normal program command or cache program command to the memory device 150 depending on the characteristic of the write data. For example, when sequential data need to be programmed to the memory device 150, the processor 134 may provide the cache program command to the memory device 150. On the other hand, when non-sequential data need to be programmed to the memory device 150, the processor 134 may provide the normal program command to the memory device 150.

The memory device 150 may program the write data based on the program command provided from the processor 134. The plurality of dies included in the memory device 150 may be typically set to a state in which a normal program operation can be performed according to the normal program command (hereafter, referred to as a normal state). However, the memory device 150 receiving the cache program command may set a die, to which the write data is to be programmed (hereafter, referred to as a target die), to a state in which a cache program operation can be performed (hereafter, referred to as a cache state). Furthermore, after the cache program operation is completed, the memory device 150 may automatically set the target die to the normal state.

A program operation based on the cache program command and a program operation based on the normal program command will be described with reference to FIGS. 5A to 5C.

For example, the controller 130 may perform an operation requested by the host 102 in the memory device 150 through the processor 134, which is implemented as a microprocessor, a CPU, or the like. Also, the controller 130 may perform a background operation on the memory device 150 through the processor 134, which may be realized as a microprocessor or a CPU. The background operation performed on the memory device 150 may include a garbage collection (GC) operation, a wear-leveling (WL) operation, a map flush operation, or a bad block management operation.

The state manager 146 may manage operation statuses of the plurality of dies included in the memory device 150 under control of the processor 134. The state manager 146 may store a state management table 148, and update the state management table 148 whenever the operation statuses of the respective dies are changed. The state manager 146 will be described with reference to FIG. 1B.

FIG. 1B is a conceptual view illustrating the state management table 148 in accordance with the present embodiment. For convenience of description, FIG. 1B may be based on the supposition that four dies are coupled to each channel.

The state manager 146 may check whether each of the dies is performing a program operation or not. The state manager 146 may determine that a die which is performing a program operation is in a 'busy' state, and a die which is not performing a program operation is in a 'ready' state. Referring to the state management table 148 illustrated in FIG. 1B, the operation statuses of first and second dies coupled to a first channel may be checked as the 'ready' state. Furthermore, the operation statuses of third and fourth dies coupled to the first channel may be checked as the 'busy' state.

The state manager 146 may update the operation statuses of the respective dies. For example, when write data to be programmed to a die which has maintained the 'ready' state is provided to the memory device 150, the state manager 146 may update the operation status of the die from the 'ready' state to the 'busy' state. On the other hand, when additional write data are not provided to a die which has maintained the 'busy' state, the state manager 146 may update the operation status of the die from the 'busy' state to the 'ready' state.

The state management table 148 illustrated in FIG. 1B shows that no program operation is being performed in the first die at the moment. However, when a program operation is performed in the first die later, the operation status of the first die may be updated from the 'ready' state to the 'busy' state. On the other hand, when a program operation is being performed in the third die at the moment but ended later, the operation status of the third die may be updated from the 'busy' state to the 'ready' state.

Referring to back to FIG. 1A, the controller 130 may further include an error correction code (ECC) circuit and a power management unit (PMU) which are not illustrated.

The ECC circuit may correct an error bit of data processed by the memory device 150, and include an ECC encoder and an ECC decoder.

The ECC encoder may generate data having a parity bit added thereto by performing error correction encoding on data to be programmed to the memory device 150, and the data having a parity bit added thereto may be stored in the memory device 150. When data stored in the memory device 150 is read, the ECC decoder may detect and correct an error contained in the data read from the memory device 150.

The ECC circuit may perform error correction using coded modulation such as a low density parity check (LDPC) code, Bose, Chaudhri, Hocquenghem (BCH) code, turbo code, Reed-Solomon code, convolution code, recursive systematic code (RSC), trellis-coded modulation (TCM) or block coded modulation (BCM). However, the present embodiment is not limited thereto. The ECC circuit may include all circuits, modules, systems or devices for error correction.

The PMU may provide and manage power of the controller 130. That is, the PMU may provide and manage power of the components included in the controller 130.

A memory device in a memory system in accordance with embodiments of the present invention is described in more detail with reference to FIGS. 2 to 4.

Figure 2:
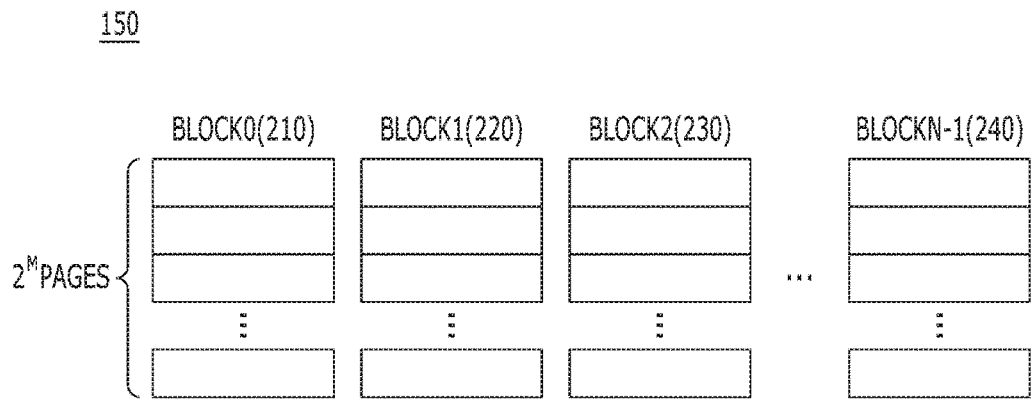
FIG. 2 is a schematic diagram illustrating a memory device of a memory system in accordance with an embodiment of the present disclosure.

FIG. 2 is a schematic diagram illustrating a memory device, e.g., the memory device 150. FIG. 3 is a circuit diagram illustrating a configuration of a memory cell array of a memory block 330 in the memory device 150. FIG. 4 is a schematic diagram illustrating a 3D structure of the memory device 150.

Referring to FIG. 2, the memory device 150 may include a plurality of memory blocks BLOCK0 (210) to BLOCKN-1 (240), where N is an integer greater than 1. Each of the blocks BLOCK0 to BLOCKN-1 may include a plurality of pages, for example, $2^M$ or M pages, the number of which may vary according to circuit design, M being an integer greater than 1. Each of the pages may include a plurality of memory cells that are coupled to a plurality of word lines WL.

Also, memory cells in the respective memory blocks BLOCK0 to BLOCKN-1 may be one or more of a single level cell (SLC) memory block storing 1-bit data or a multi-level cell (MLC) memory block storing 2-bit data. Hence, the memory device 150 may include SLC memory blocks or MLC memory blocks, depending on the number of bits which can be expressed or stored in each of the memory cells in the memory blocks. The SLC memory blocks may include a plurality of pages which are embodied by memory cells, each storing one-bit data. The SLC memory blocks may generally have higher data computing performance and higher durability than the MLC memory blocks. The MLC memory blocks may include a plurality of pages which are embodied by memory cells each storing multi-bit data (for example, 2 or more bits). The MLC memory blocks may generally have larger data storage space, that is, higher integration density, than the SLC memory blocks. In another embodiment, the memory device 150 may include a plurality of triple level cell (TLC) memory blocks. In yet another embodiment, the memory device 150 may include a plurality of quadruple level cell (QLC) memory blocks. The TCL memory blocks may include a plurality of pages which are embodied by memory cells each capable of storing 3-bit data. The QLC memory blocks may include a plurality of pages which are embodied by memory cells each capable of storing 4-bit data.

The memory device 150 may store a larger amount of data in the MLC memory block than the SLC memory block. However, when the SLC memory block is used, the memory device 150 may process data faster than when the MLC memory block is used. That is, the SLC memory block and the MLC memory block may have different advantages and disadvantages. Therefore, when data needs to be rapidly processed, the processor 134 may control the memory device 150 to program data to the SLC memory block. On the other hand, when a large storage space is needed, the processor 134 may control the memory device 150 to program data to the MLC memory block. As a result, the processor 134 may decide the type of a memory block in which data are to be stored, depending on situations.

Instead of a nonvolatile memory, the memory device 150 may be implemented by any one of a phase change random access memory (PCRAM), a resistive random access memory (RRAM(ReRAM)), a ferroelectrics random access memory (FRAM), and a spin transfer torque magnetic random access memory (STT-RAM(STT-MRAM)).

The memory blocks 210, 220, 230, 240 may store the data transferred from the host 102 through a program operation, and may transfer data stored therein to the host 102 through a read operation.

Figure 3:
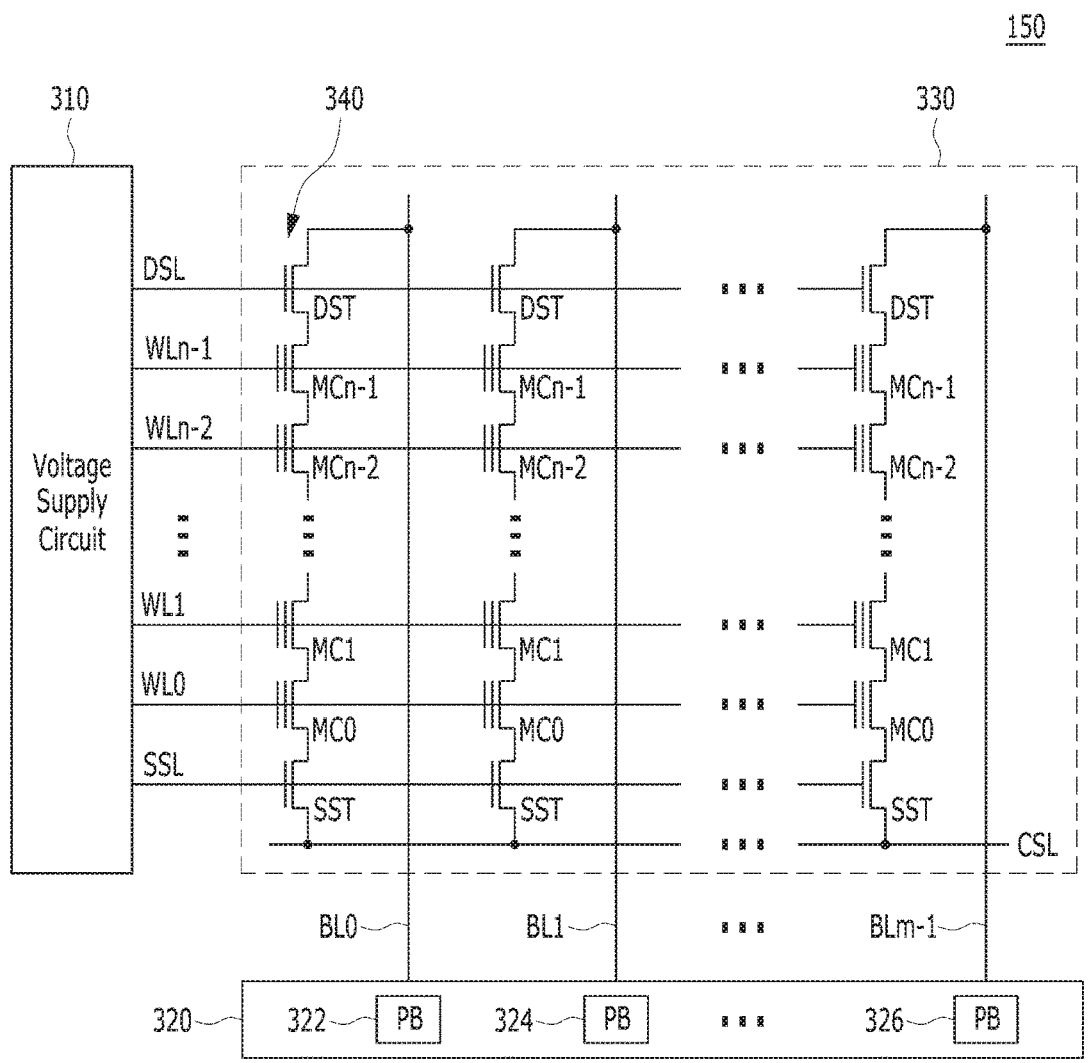
FIG. 3 is a circuit diagram illustrating a memory cell array of a memory block in a memory device in accordance with an embodiment of the present disclosure.
Figure 4:
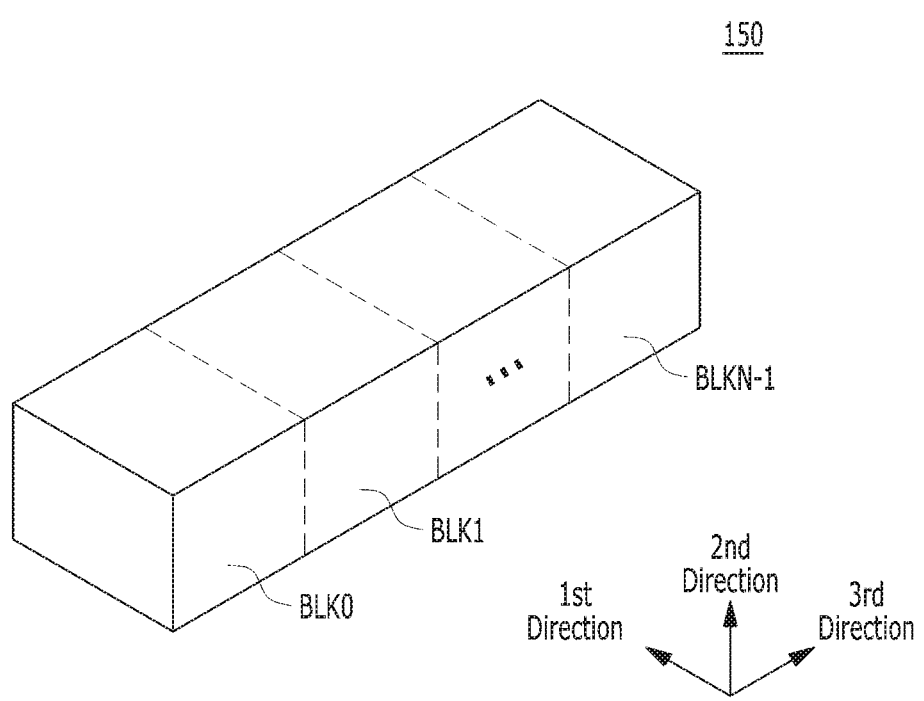
FIG. 4 is a schematic diagram illustrating a three-dimensional structure of a memory device in accordance with an embodiment of the present disclosure.

Next, referring to FIG. 3, the plurality of memory blocks included in the memory device 150 of the memory system 110 may include a plurality of cell strings 340 which are implemented as a memory cell array 330, and coupled to bit lines BL0 to BLm-1, respectively. The cell string 340 of each column may include one or more drain select transistors DST and one or more source select transistors SST. Between the drain and source select transistors DST and SST, a plurality of memory cells MC0 to MCn-1 may be coupled in series. In an embodiment, each of the memory cell transistors MC0 to MCn-1 may be embodied by an MLC capable of storing data information of a plurality of bits. Each of the cell strings 340 may be electrically coupled to a corresponding bit line among the plurality of bit lines BL0 to BLm-1.

FIG. 3 illustrates the memory cell array 330 composed of NAND flash memory cells. However, the plurality of memory blocks included in the memory device 150 in accordance with the present embodiment are not limited to only a NAND flash memory, but implemented as a NOR-type flash memory, a hybrid flash memory in which two or more types of memory cells are mixed, or a one-NAND flash memory having a controller embedded in a memory chip.

The voltage supply circuit 310 of the memory device 150 may provide word line voltages (for example, a program voltage, read voltage, pass voltage and the like) to be supplied to word lines, is respectively, and a voltage to be supplied to a bulk (for example, a well region) in which memory cells are formed, depending on operation modes. At this time, a voltage generation operation of the voltage supply circuit 310 may be performed under control of a control circuit (not illustrated). Furthermore, the voltage supply circuit 310 may generate a plurality of variable read voltages in order to generate a plurality of read data, select one of the memory blocks (or sectors) of the memory cell array and select one of the word lines of the selected memory block in response to control of the control circuit, and provide word line voltages to the selected word line and the unselected word lines, respectively.

The memory device 150 may include a read/write circuit 320 which is controlled by the control circuit. During a verification/normal read operation, the read/write circuit 320 may operate as a sense amplifier for reading (sensing and amplifying) data from the memory cell array. During a program operation, the read/write circuit 320 may operate as a write driver for supplying a voltage or a current to bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs). Each of the page buffers 322 to 326 may include a plurality of latches (not illustrated).

The memory device 150 may be implemented as a two-dimensional or three-dimensional memory device. Specifically, as illustrated in FIG. 4, the memory device 150 may be implemented as a nonvolatile memory device with a three-dimensional stack structure. When the memory device 150 is implemented as a nonvolatile memory device with a three-dimensional stack structure, the memory device 150 may include a plurality of memory blocks BLK0 to BLKN-1. FIG. 4 is a block diagram illustrating memory blocks of the memory device 150 illustrated in FIG. 1A, and each of the memory blocks may be implemented as a memory block having a three-dimensional structure (or vertical structure). For example, each of the memory blocks may include structures extended in first to third directions, e.g. an x-axis direction, a y-axis direction and a z-axis direction, and thus have a three-dimensional structure.

Each memory block 330 included in the memory device 150 may include a plurality of NAND strings NS that are extended in the second direction, and a plurality of NAND strings NS that are extended in the first direction and the third direction. Herein, each of the NAND strings NS may be coupled to a bit line BL, at least one string selection line SSL, at least one ground selection line GSL, a plurality of word lines WL, at least one dummy word line DWL, and a common source line CSL, and each of the NAND strings NS may include a plurality of transistor structures TS.

That is, each of the memory cell arrays 330 included in each of the plurality of memory blocks of the memory device 150 may be coupled to the plurality of bit lines BL, the plurality of string select lines SSL, the plurality of ground select lines GSL, the plurality of word lines WL, the plurality of dummy word lines DWL and the plurality of common source lines CSL, and thus include a plurality of NAND strings NS. In each of the memory cell arrays 330, a plurality of NAND strings NS may be coupled to one bit line BL, such that a plurality of transistors can be implemented in one NAND string NS. Furthermore, the string select transistors SST of the respective NAND strings NS may be coupled to the corresponding bit line BL, and the ground select transistors GST of the respective NAND strings NS may be coupled to the common source line CSL. The memory cells MC may be provided between the string select transistors SST and the ground select transistors GST of the respective NAND strings NS. That is, the plurality of memory cells may be implemented in each of the memory cell arrays 330 in the plurality of memory blocks of the memory device 150.

Hereafter, a program operation of write data in accordance with the present embodiment will be described with reference to FIGS. 5A to 5C. For convenience of description, FIGS. 5A to 5C do not consider the operation of the state manager 146.

Figure 5A:
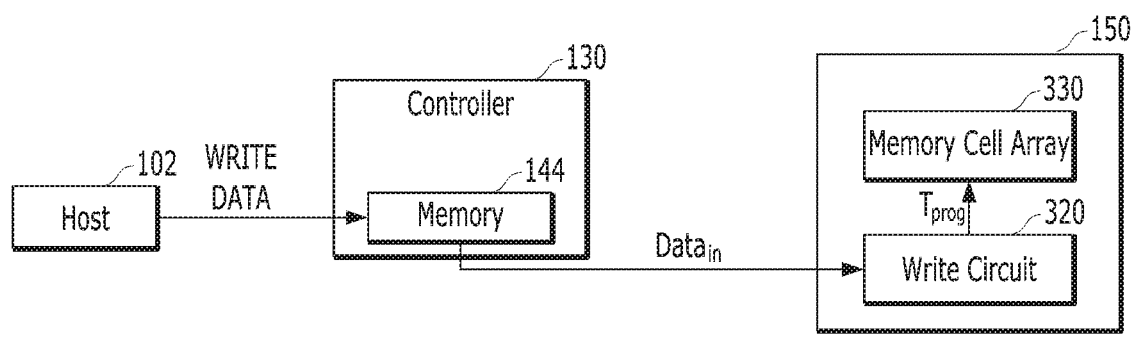
FIG. 5A is a conceptual view illustrating a data transfer path in accordance with an embodiment.

FIG. 5A is a conceptual view illustrating a transfer path of write data in accordance with an embodiment. A write circuit 320 illustrated in FIG. 5A may be the same as the read/write circuit 320 illustrated in FIG. 3. Since FIGS. 5A to 5C do not consider a read operation, the read/write circuit 320 of FIG. 3 may be expressed as the write circuit 320. FIGS. 5A to 5C illustrate only core components of the present embodiment, for convenience of description.

First, the host 102 may provide a write command and write data to the controller 130. Furthermore, the host 102 may provide the controller 130 with a logical address corresponding to the write data as well as the write data.

The controller 130 may receive the write data and the logical address corresponding to the write data through the host I/F 132. The write data may be temporarily stored in the memory 144 under control of the processor 134. The processor 134 may assign a physical address in which the write data are to be actually stored. The assigned physical address may include die information, memory block information and page information.

The processor 134 may provide the write data stored in the memory 144 and a program command to the memory device 150 through the memory I/F 142. Furthermore, the processor 134 may provide the write data and the program command to the memory device 150 in consideration of the operation status of a target die and the type of the program command.

The write data provided from the controller 130 may be buffered in one or more page buffers within the write circuit 320 included in the memory device 150. The write circuit 320 may program the write data to a physical address corresponding to the write data according to the program command provided from the controller 130. In FIG. 5A, the physical address may be displayed only as the memory cell array 330.

Figure 5B:
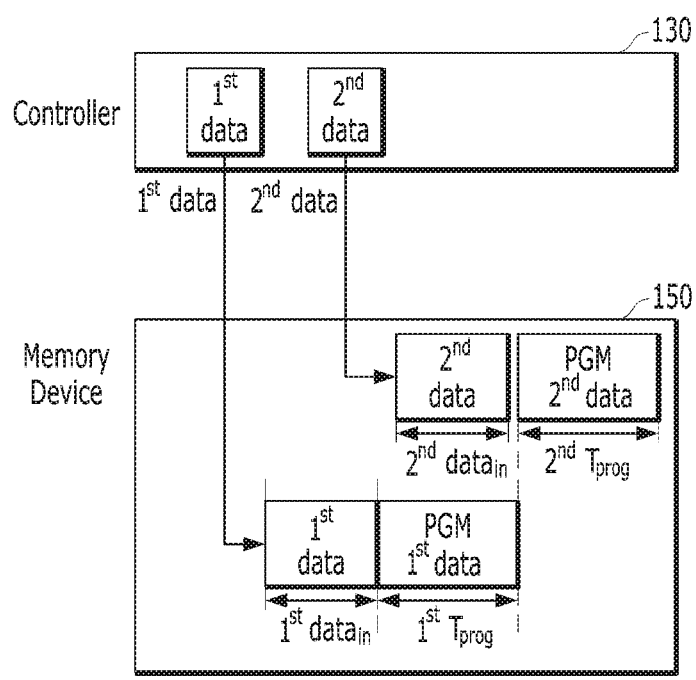
FIG. 5B is a diagram illustrating a cache program operation in accordance with an embodiment.

FIG. 5B is a conceptual view illustrating a cache program operation in accordance with an embodiment. For convenience of description, suppose that $1^{st}$ data and $2^{nd}$ data are sequential data. Furthermore, suppose that the target die is in a 'normal' state at the initial stage.

First, the controller 130 may provide the $1^{st}$ data and a cache program command to the memory device 150 in order to program the $1^{st}$ data to the target die. At this time, the memory device 150 may buffer the $1^{st}$ data in one or more page buffers. The memory device 150 may change the state of the target die from the 'normal' state to a 'cache' state. Then, the memory device 150 may program the $1^{st}$ data to the target die.

While the $1^{st}$ data is programmed to the target die, the controller 130 may provide the $2^{nd}$ data and the cache program command to the memory device 150 in order to program the $2^{nd}$ data. The memory device 150 may buffer the $2^{nd}$ data in one or more page buffers, while programming the $1^{st}$ data to the target die. Since the target die is in the 'cache' state at the moment, the memory device 150 may not perform a separate state change operation.

After the program operation of the $1^{st}$ data is completed, the memory device 150 may program the $2^{nd}$ data to the target die. While the $2^{nd}$ data is programmed, a program command and data may not be separately provided from the controller 130. Therefore, the memory device 150 may automatically change the state of the target die to the 'normal' state from the 'cache' state after the program operation for the $2^{nd}$ data is completed.

Figure 5C:
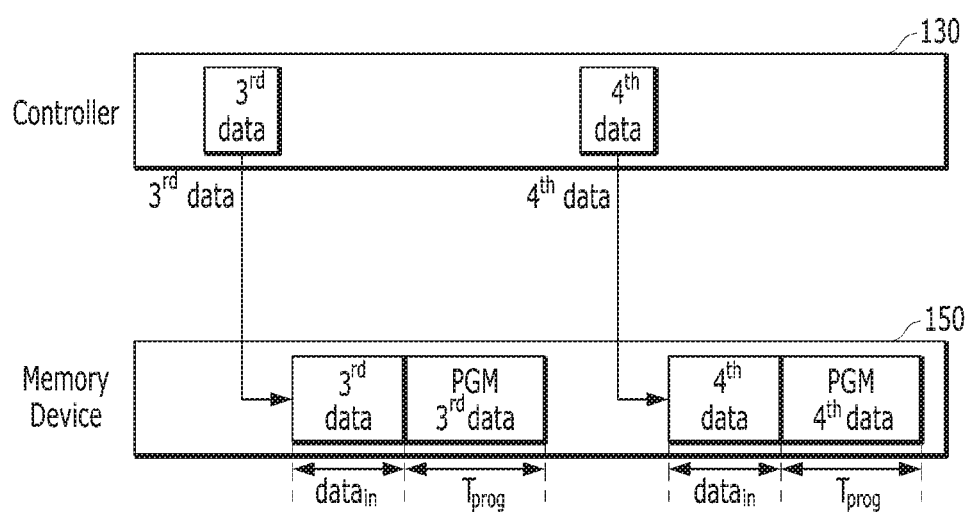
FIG. 5C is a diagram illustrating a normal program operation in accordance with an embodiment.

FIG. 5C is a conceptual view illustrating a normal program operation in accordance with the present embodiment. For convenience of description, suppose that $3^{rd}$ data and $4^{th}$ data are non-sequential data. Furthermore, suppose that the target die is in the 'normal' state at the initial stage.

First, the controller 130 may provide the $3^{rd}$ data and a normal program command to the memory device 150 in order to program the $3^{rd}$ data to the target die. At this time, the memory device 150 may buffer the $3^{rd}$ data in one or more page buffers. Since the target die is in the 'normal' state at the moment, the memory device 150 may not perform a separate state change operation. Then, the memory device 150 may program the $3^{rd}$ data to the target die.

After the program operation for the $3^{rd}$ data is completed, the controller 130 may provide the $4^{th}$ data and the normal program command to the memory device 150 in order to program the $4^{th}$ data to the target die. At this time, the memory device 150 may buffer the $4^{th}$ data in one or more page buffers. Since the target die is in 'normal' state at the moment, the memory device 150 may not perform a separate state change operation. Then, the memory device 150 may program the $4^{th}$ data to the target die.

As such, the memory system 110 in accordance with the present embodiment may program data using different commands. Hereafter, a method capable of programming data more efficiently using the above-described program command will be described.

FIGS. 6A to 6E are conceptual views illustrating a data program operation of the memory system 110 in accordance with an embodiment. In FIGS. 6A to 6E, the controller 130 may program $1^{st}$ to $3^{rd}$ data data1 to data3 stored in the memory 144 to the memory device 150. All operations of the controller 130, which will be described below, may be performed under control of the processor 134. For convenience of description, the $1^{st}$ data data1 and the $2^{nd}$ data data2 are sequential data, and the $3^{rd}$ data data3 is non-sequential data. Furthermore, the target die is a first die 650, and the initial state of the target die is a 'ready' state and a 'normal' state. Furthermore, the $1^{st}$ to $3^{rd}$ data data1 to data3 are programmed to a first memory block 655 included in the first die 650. However, this is only an example, and the present embodiment is not limited thereto.

Figure 6A:
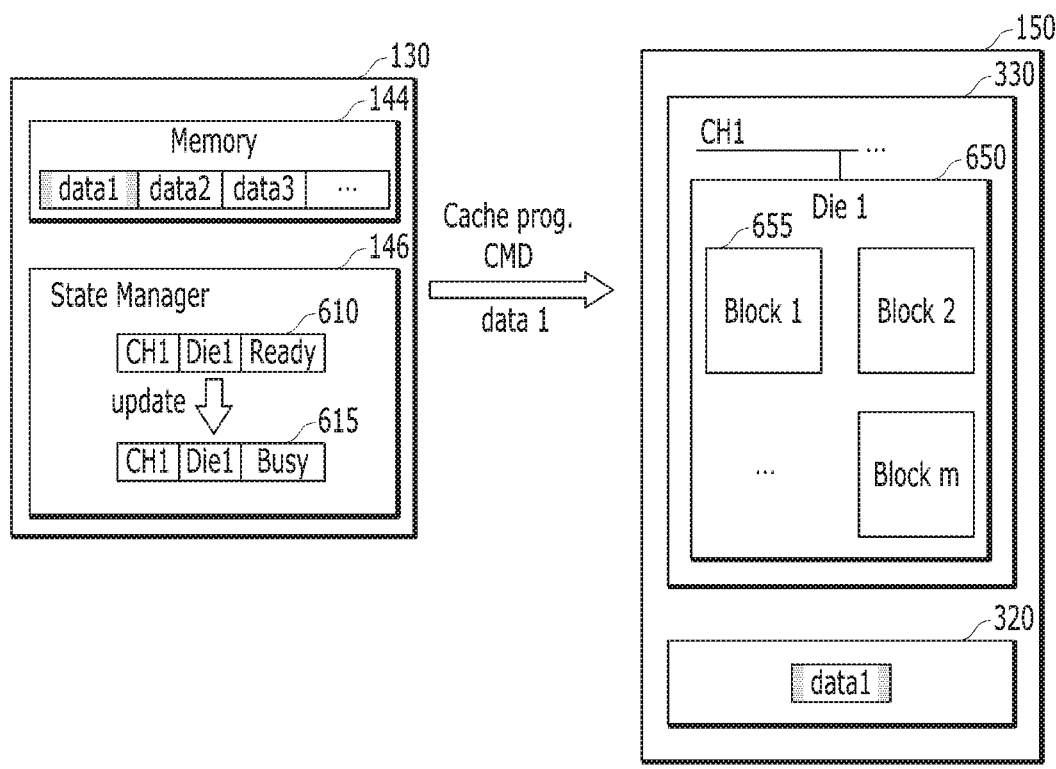
FIGS. 6A to 6E are diagram illustrating an operation of a memory system in accordance with an embodiment.

First, referring to FIG. 6A, the controller 130 may provide the $1^{st}$ data data1 to the memory device 150 in order to program the $1^{st}$ data data1 stored in the memory 144 to the first memory block 655 of the first die 650. Furthermore, the controller 130 may provide a cache program command and the $1^{st}$ data data1 to the memory device 150 in order to program the $1^{st}$ data data1.

The memory device 150 may buffer the $1^{st}$ data data1 received from the controller 130 in one or more page buffers within the write circuit 320. Then, the memory device 150 may change the state of the first die 650 to the 'cache' state from the 'normal' state.

At this time, the controller 130 may update the operation status of the first die 650 within the state management table 148 stored in the state manager 146. Specifically, the controller 130 may update a first state table 610 in which the state of the first die 650 is 'ready' state into a second state table 615 in which the state of the first die 650 is the 'busy' state.

Figure 6B:
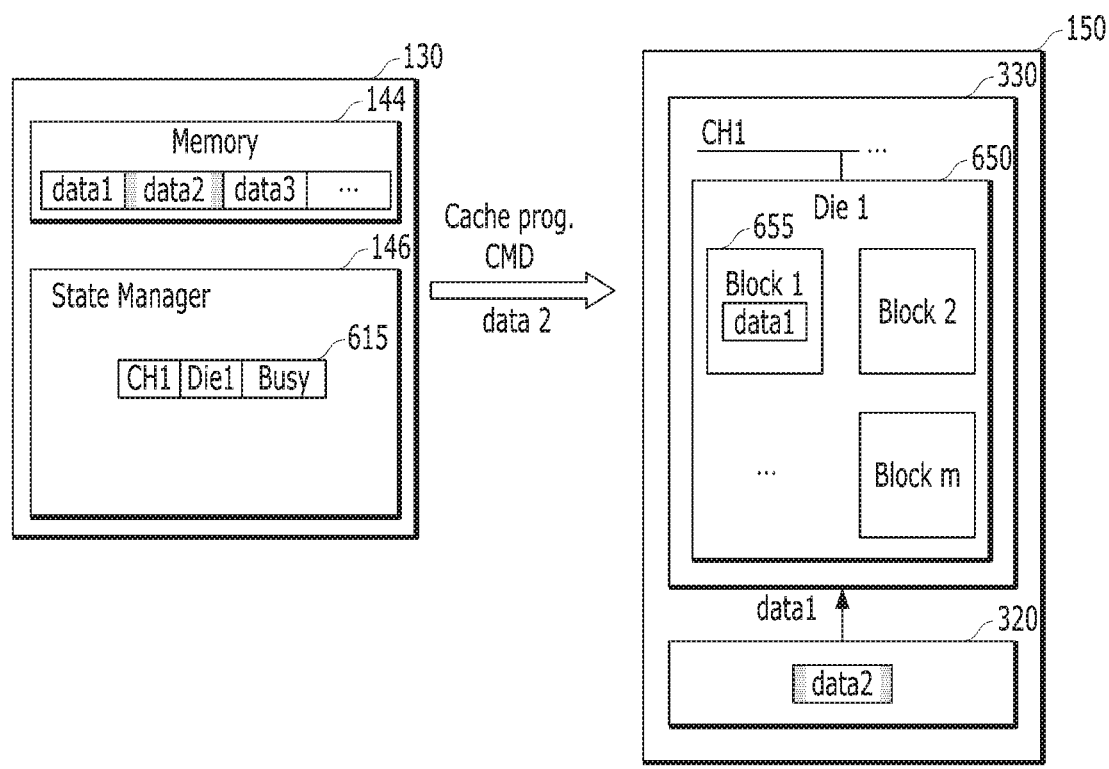

Referring to FIG. 6B, the memory device 150 may program the $1^{st}$ data data1 to the first memory block 655 based on the cache program command.

While the $1^{st}$ data data1 is programmed, the controller 130 may provide the $2^{nd}$ data data2 stored in the memory 144 to the memory device 150 in order to program the $2^{nd}$ data data2 to the first memory block 655. Furthermore, the controller 130 may provide the cache program command and the $2^{nd}$ data data2 to the memory device 150 in order to program the $2^{nd}$ data data2.

The memory device 150 may buffer the $2^{nd}$ data data2 received from the controller 130 in one or more page buffers within the write circuit 320 while programming the $1^{st}$ data data1 to the first memory block 655.

Figure 6C:
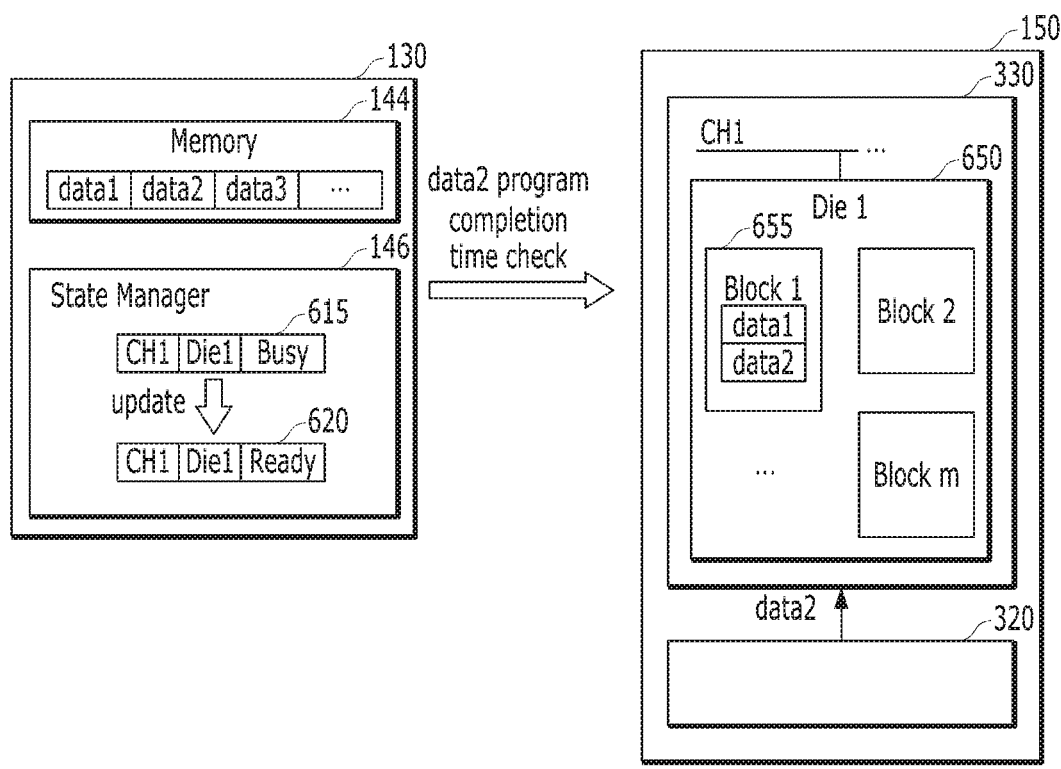

Referring to FIG. 6C, when the program operation for the $1^{st}$ data data1 is completed, the memory device 150 may sequentially program the $2^{nd}$ data data2 to the first memory block 655. Then, the memory device 150 may complete the program operation for the $2^{nd}$ data data2. Since new data are not provided to the memory device 150 until the program operation for the $2^{nd}$ data data2 is completed, the memory device 150 may automatically change the state of the first die 650 to the 'normal' state from the 'cache' state.

The controller 130 may check the point of time that the program operation for the $2^{nd}$ data data2 is completed in the memory device 150. At this time, the controller 130 may update the second state table 615 in which the operation status of the first die 650 is recorded as the 'busy' state into a third state table 620 in which the operation status of the first die 650 is recorded as the 'ready' state.

Unlike the above-described example, when new data with a cache program command are provided from the controller 130 while the program operation for the $2^{nd}$ data data2 is performed, the memory device 150 may program the new data after the $2^{nd}$ data data2 is programmed.

Figure 6D:
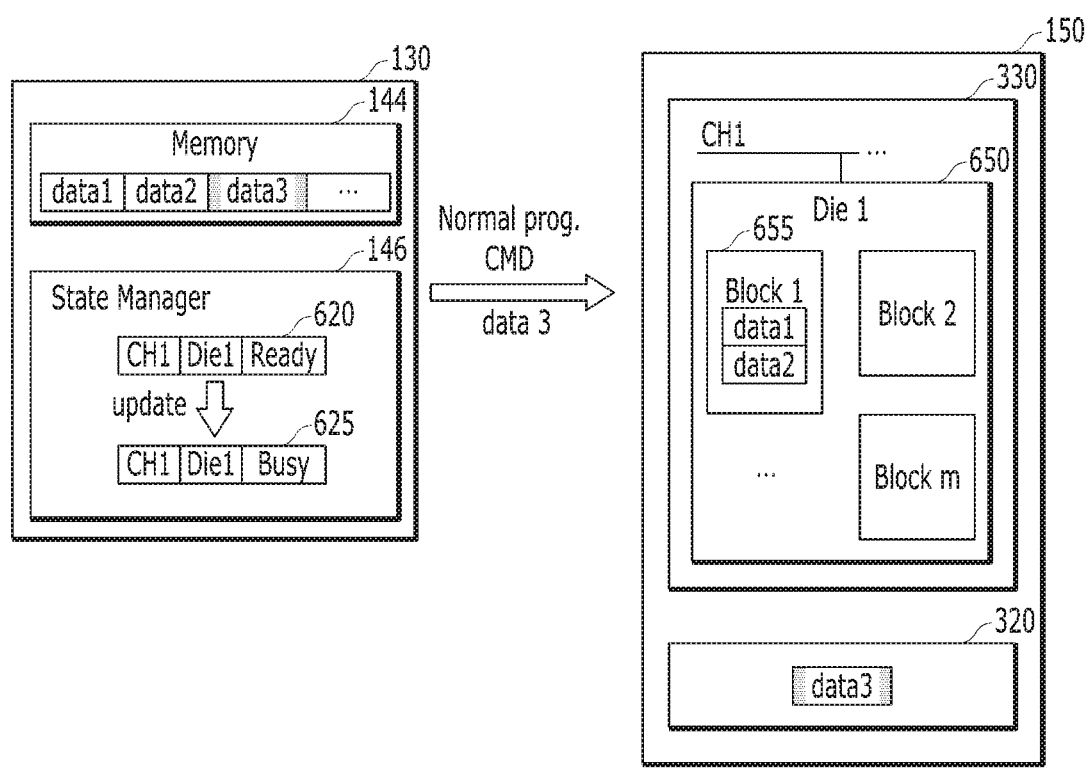

On the other hand, referring to FIG. 6D, the controller 130 may check the state of the first die 650, and then provide the $3^{rd}$ data data3 to the memory device 150, because the $3^{rd}$ data data3 is non-sequential data different from the $1^{st}$ and $2^{nd}$ data data1 and data2 which have been programmed before. Specifically, the controller 130 may check that the operation status of the first die 650, recorded in the third state table 620, is the 'ready' state, and provide the $3^{rd}$ data data3 to the memory device 150. Furthermore, the controller 130 may provide a normal program command to the memory device 150 with the $3^{rd}$ data data3.

The memory device 150 may buffer the $3^{rd}$ data data3 received from the controller 130 in one or more page buffers within the write circuit 320. Then, the memory device 150 may maintain the first die 650 in the 'normal' state.

At this time, the controller 130 may update the third state table 620 in which the state of the first die 650 is the 'ready' state into a fourth state table 625 in which the state of the first die 650 is the 'busy' state.

Figure 6E:
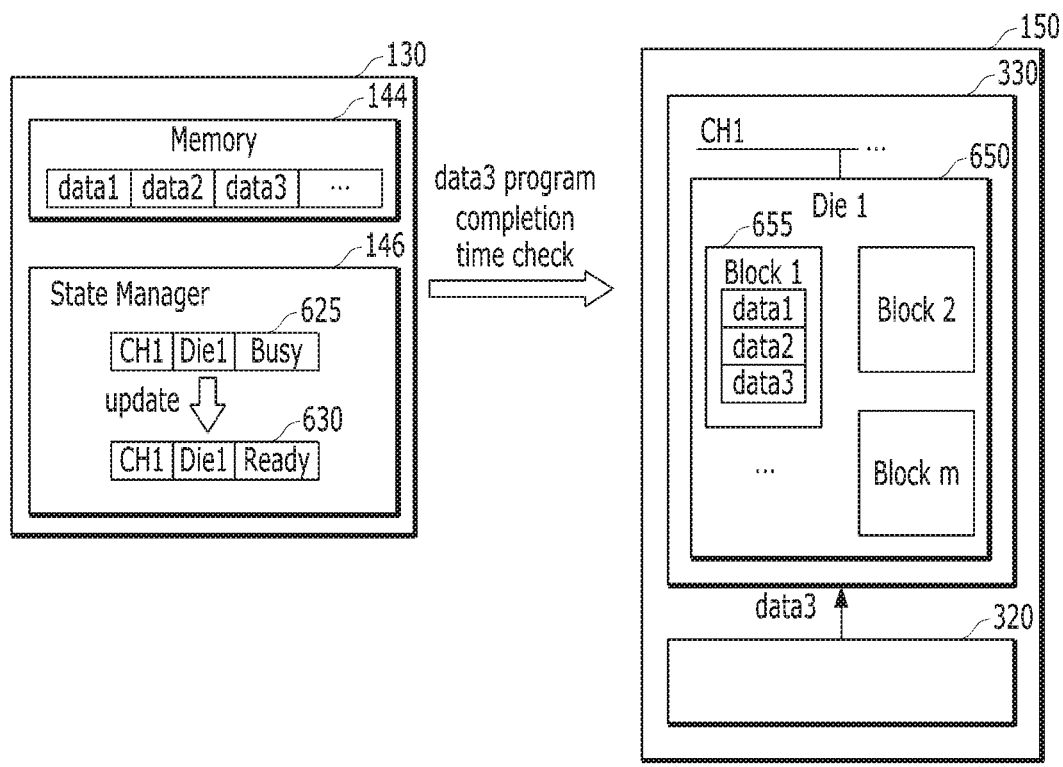

Referring to FIG. 6E, the memory device 150 may program the $3^{rd}$ data3 to the first memory block 655. Then, the memory device 150 may complete the program operation for the $3^{rd}$ data data3.

The controller 130 may check the point of time that the program operation for the $3^{rd}$ data data3 is completed in the memory device 150. At this time, the controller 130 may update the fourth state table 625 in which the operation status of the first die 650 is recorded as the 'busy' state into a fifth state table 630 in which the operation status of the first die 650 is recorded as the 'ready' state.

As described above, when the normal program command is is provided after the cache program command is provided to the memory device 150, the memory device 150 may automatically switch the state of the target die from the 'cache' state to the 'normal' state. As a result, the controller 130 can save a separate management cost caused by the use of cache program.

Figure 7:
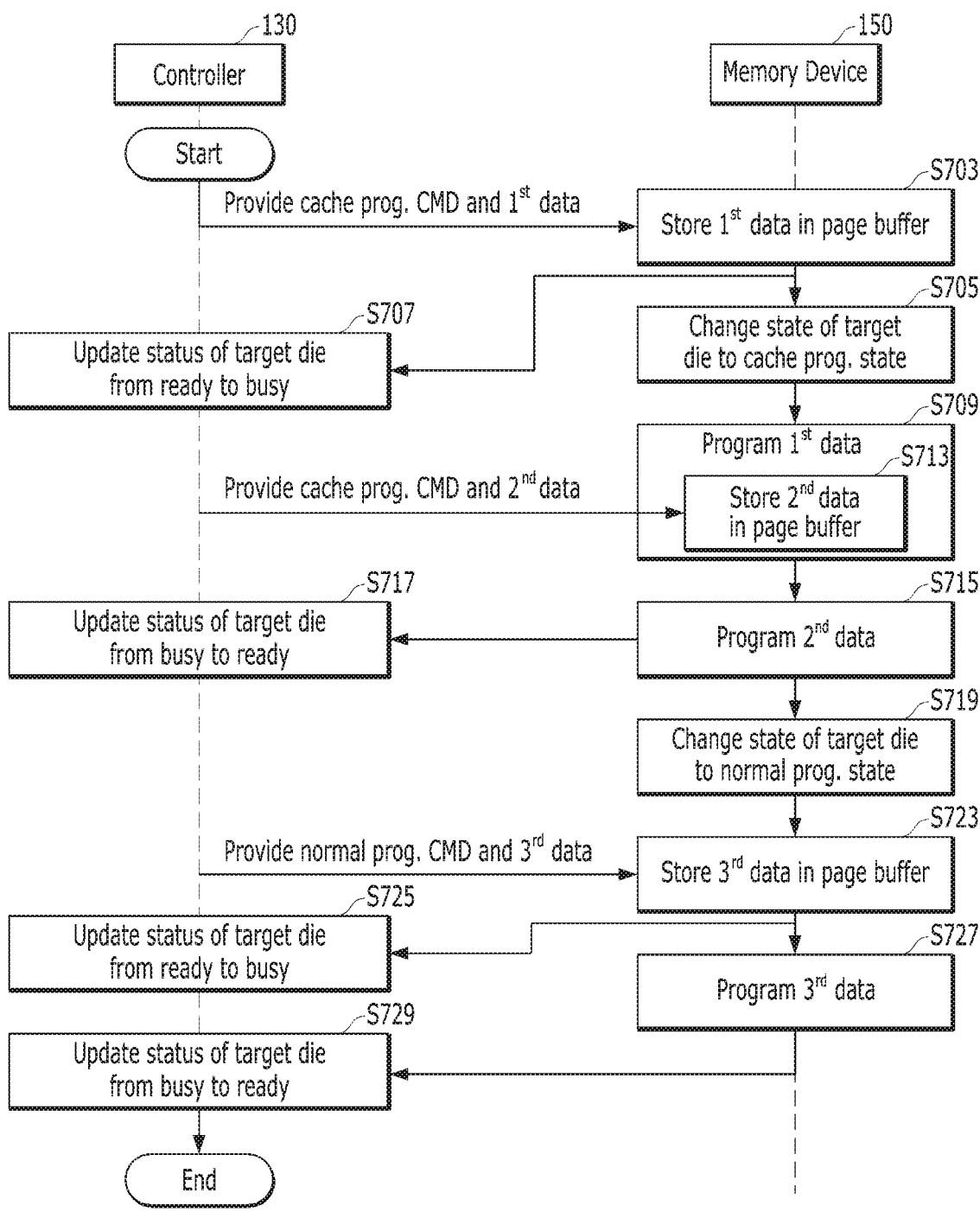
FIG. 7 is a flowchart illustrating an operation of the memory system in accordance with an embodiment.

FIG. 7 is a flowchart illustrating an operation process of the memory system 110 in accordance with an embodiment. FIG. 7 illustrates an operation process of the memory system 110 based on FIGS. 6A to 6E.

First, at step S701, the controller 130 may provide the memory device 150 with $1^{st}$ data stored in the memory 144 and a cache program command.

At step S703, the memory device 150 may buffer the $1^{st}$ data received from the controller 130 in a page buffer within the write circuit 320.

At step S705, the memory device 150 may change the state of the target data from a 'normal' state to a 'cache' state.

At step S707, the controller 130 may update the operation status of the target die from the 'ready' state to the 'busy' state.

At step S709, the write circuit 320 may program the $1^{st}$ data to one or more memory blocks included in the target die.

At this time, while the program operation for the $1^{st}$ data is performed, the controller 130 may provide the memory device 150 with $2^{nd}$ data stored in the memory 144 and a cache program command at step S711.

At step S713, while the program operation for the $1^{st}$ data is performed, the memory device 150 may buffer the $2^{nd}$ data in a page buffer within the write circuit 320.

After the program operation for the $1^{st}$ data is completed, the write circuit 320 may program the $2^{nd}$ data to the one or more memory blocks included in the target die at step S715.

After the program operation for the $2^{nd}$ data is completed, the controller 130 may update the operation status of the target die from the 'busy' state to the 'ready' state at step S717. That is because new data was not provided to the memory device 150 until the program operation for the $2^{nd}$ data is completed.

At step S719, the memory device 150 may change the state of the target die from the 'cache' state to the 'normal' state.

At step S721, the controller 130 may provide the memory device 150 with $3^{rd}$ data stored in the memory 144 and a normal program command.

At step S723, the memory device 150 may buffer the $3^{rd}$ data received from the controller 130 in a page buffer within the write circuit 320.

At step S725, the controller 130 may update the operation status of the target die from the 'ready' state to the 'busy' state.

At step S727, the write circuit 320 may program the $3^{rd}$ data to the one or more memory blocks included in the target die.

After the program operation for the $3^{rd}$ data is completed, the controller 130 may update the operation status of the target die from the 'busy' state to the 'ready' state at step S729.

The memory system 110 in accordance with the present embodiment may automatically switch the state of the target die to the 'normal' state without an additional operation such as an operation of providing a separate command, after the cache program operation is performed. Therefore, the memory system 100 can perform the program operation efficiently.

Hereafter, referring to FIGS. 8 to 16, a data processing system and electronic devices to which the memory system 110 described with reference to FIGS. 1A to 8 in accordance with the present embodiment and including the memory device 150 and the controller 130 is applied will be described in more detail.

Figure 8:
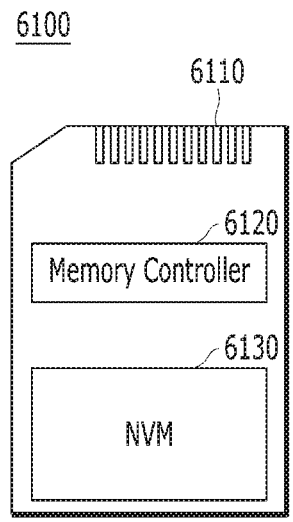
FIGS. 8 to 16 are schematic diagrams illustrating exemplary applications of a data processing system, in accordance with various embodiments of the present invention.

FIG. 8 is a diagram schematically illustrating another example of the data processing system including the memory system in accordance with an embodiment. FIG. 8 schematically illustrates a memory card system to which the memory system may be applied.

Referring to FIG. 8, the memory card system 6100 may include a memory controller 6120, a memory device 6130 and a connector 6110.

Specifically, the memory controller 6120 may be electrically connected to, and configured to access, the memory device 6130 embodied by a nonvolatile memory. For example, the memory controller 6120 may be configured to control read, write, erase and background operations of the memory device 6130. The memory controller 6120 may be configured to provide an interface between the memory device 6130 and a host, and to use firmware for controlling the memory device 6130. That is, the memory controller 6120 may correspond to the controller 130 of the memory system 110 described with reference to FIG. 1A, and the memory device 6130 may correspond to the memory device 150 of the memory system 110 described with reference to FIG. 1A.

Thus, the memory controller 6120 may include a RAM, a processor, a host interface, a memory interface and an error correction component.

The memory controller 6120 may communicate with an external device, for example, the host 102 of FIG. 1A through the connector 6110. For example, as described with reference to FIG. 1A, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system may be applied to wired/wireless electronic devices including mobile electronic devices.

The memory device 6130 may be implemented by a nonvolatile memory. For example, the memory device 6130 may be implemented by any of various nonvolatile memory devices such as an erasable and programmable ROM (EPROM) an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM).

The memory controller 6120 and the memory device 6130 may be integrated into a single semiconductor device to form a solid-state driver (SSD). Also, the memory controller 6120 and the memory device 6130 may be so integrated to form a memory card such as a PC card (PCMCIA: Personal Computer Memory Card International Association), a compact flash (CF) card, a smart media card (e.g., a SM and a SMC), a memory stick, a multimedia card (e.g., a MMC, a RS-MMC, a MMCmicro and an eMMC), an SD card (e.g., a SD, a miniSD, a microSD and a SDHC), and/or a universal flash storage (UFS).

Figure 9:
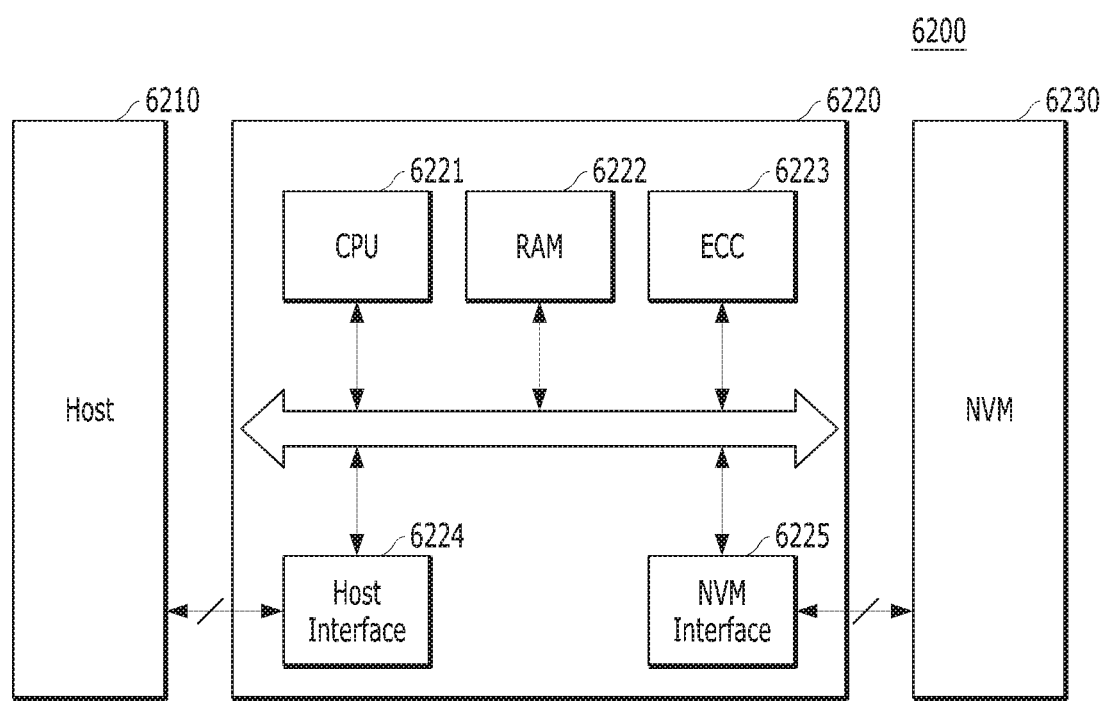

FIG. 9 is a diagram schematically illustrating another example of the data processing system including the memory system in accordance with an embodiment.

Referring to FIG. 9, the data processing system 6200 may include a memory device 6230 having one or more nonvolatile memories and a memory controller 6220 for controlling the memory device 6230. The data processing system 6200 illustrated in FIG. 9 may serve as a storage medium such as a memory card (CF, SD, micro-SD or the like) or USB device, as described with reference to FIG. 1A. The memory device 6230 may correspond to the memory device 150 in the memory system 110 illustrated in FIG. 1A, and the memory controller 6220 may correspond to the controller 130 in the memory system 110 illustrated in FIG. 1A.

The memory controller 6220 may control a read, write or erase operation on the memory device 6230 in response to a request of the host 6210. The memory controller 6220 may include one or more CPUs 6221, a buffer memory such as RAM 6222, an ECC circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or vice versa. When the RAM 6222 is used as a cache memory, the RAM 6222 may assist the memory device 6230 to operate at high speed.

The ECC circuit 6223 may generate an ECC (Error Correction Code) for correcting a failed bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. The ECC circuit 6223 may correct an error using the parity bit. The ECC circuit 6223 may correct an error using the LDPC code, BCH code, turbo code, Reed-Solomon code, convolution code, RSC or coded modulation such as TCM or BCM.

The memory controller 6220 may exchange data with the host 6210 through the host interface 6224. The memory controller 6220 may exchange data with the memory device 6230 through the NVM interface 6225. The host interface 6224 may be connected to the host 6210 through a PATA bus, a SATA bus, a SCSI, an USB, a PCIe or a NAND interface. The memory controller 6220 may have a wireless communication function with a mobile communication protocol such as WiFi or Long Term Evolution (LTE). The memory controller 6220 may be connected to an external device, for example, the host 6210 or another external device, and then exchange data with the external device. In particular, as the memory controller 6220 is configured to communicate with the external device according to one or more of various communication protocols, the memory system and the data processing system may be applied to wired/wireless electronic devices, particularly a mobile electronic device.

Figure 10:
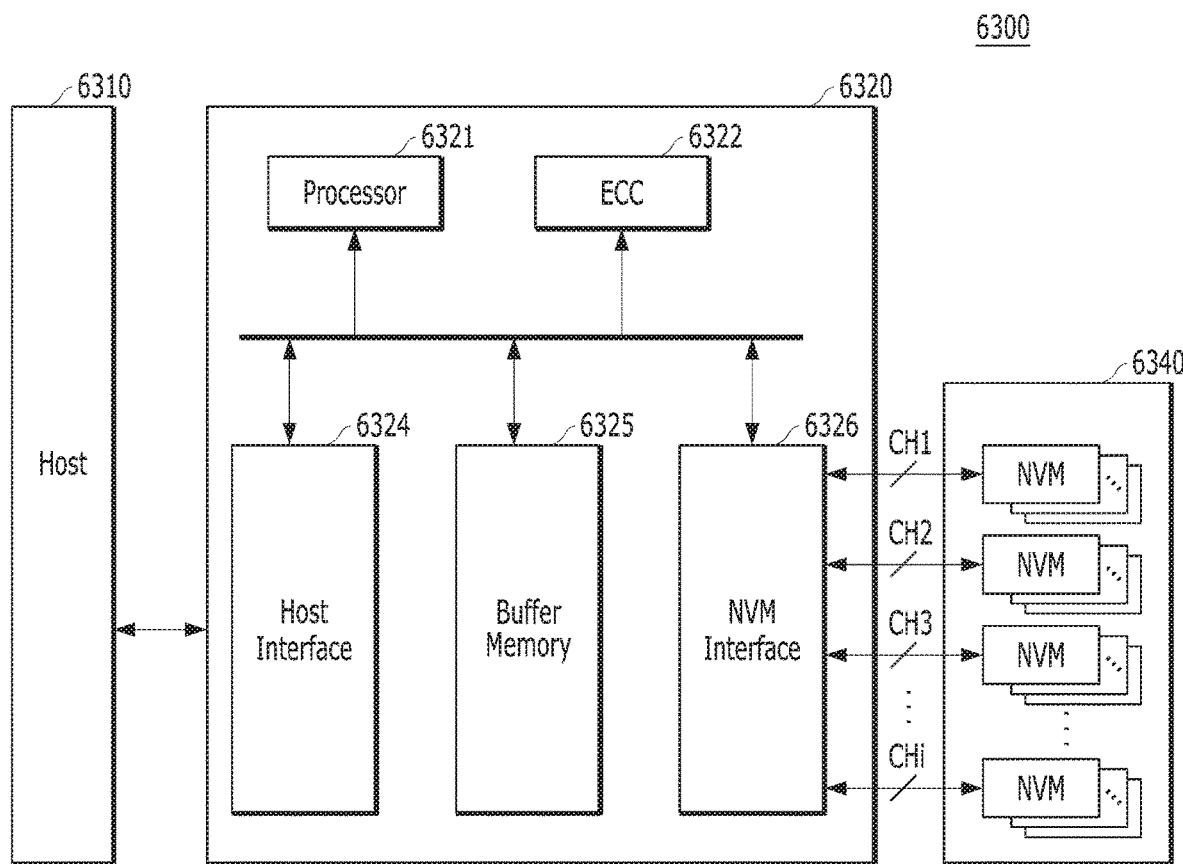

FIG. 10 is a diagram schematically illustrating another example of the data processing system including the memory system in accordance with an embodiment. FIG. 10 schematically illustrates an SSD to which the memory system may be applied.

Referring to FIG. 10, the SSD 6300 may include a controller 6320 and a memory device 6340 including a plurality of nonvolatile memories. The controller 6320 may correspond to the controller 130 in the memory system 110 of FIG. 1A, and the memory device 6340 may correspond to the memory device 150 in the memory system of FIG. 1A.

Specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340. Further, the buffer memory 6325 may temporarily store meta data of the plurality of flash memories NVM, for example, map data including a mapping table. The buffer memory 6325 may be embodied by any of a variety of volatile memories such as a DRAM, a SDRAM, a DDR SDRAM, a LPDDR SDRAM and a GRAM or nonvolatile memories such as a FRAM, a ReRAM, a STT-MRAM and a PRAM. FIG. 10 illustrates that the buffer memory 6325 is embodied in the controller 6320. However, the buffer memory 6325 may be external to the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1A may be applied may be provided to embody a data processing system, for example, a RAID (Redundant Array of Independent Disks) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 11:
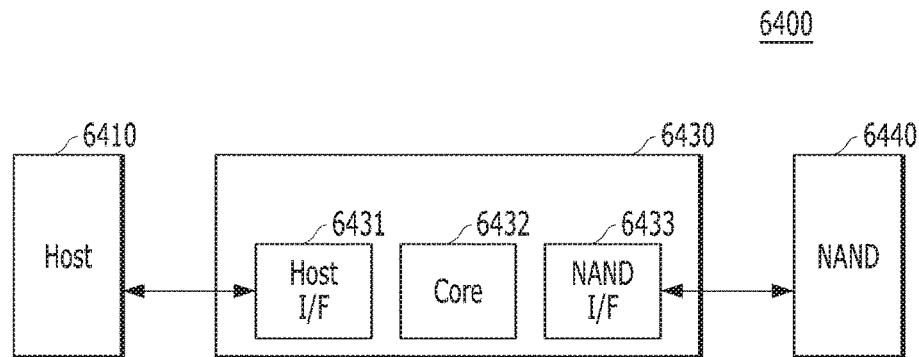

FIG. 11 is a diagram schematically illustrating another example of the data processing system including the memory system in accordance with an embodiment. FIG. 11 schematically illustrates an embedded Multi-Media Card (eMMC) to which the memory system may be applied.

Referring to FIG. 11, the eMMC 6400 may include a controller 6430 and a memory device 6440 embodied by one or more NAND flash memories. The controller 6430 may correspond to the controller 130 in the memory system 110 of FIG. 1A. The memory device 6440 may correspond to the memory device 150 in the memory system 110 of FIG. 1A.

Specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1A. Furthermore, the host interface 6431 may serve as a serial interface, for example, UHS ((Ultra High Speed)-I/UHS-II) interface.

FIGS. 12 to 15 are diagrams schematically illustrating other examples of the data processing system including the memory system in accordance with embodiments. FIGS. 12 to 15 schematically illustrate UFS (Universal Flash Storage) systems to which the memory system may be applied.

Referring to FIGS. 12 to 15, the UFS systems 6500, 6600, 6700, 6800 may include hosts 6510, 6610, 6710, 6810, UFS devices 6520, 6620, 6720, 6820 and UFS cards 6530, 6630, 6730, 6830, respectively. The hosts 6510, 6610, 6710, 6810 may serve as application processors of wired/wireless electronic devices, particularly mobile electronic devices, the UFS devices 6520, 6620, 6720, 6820 may serve as embedded UFS devices, and the UFS cards 6530, 6630, 6730, 6830 may serve as external embedded UFS devices or removable UFS cards.

The hosts 6510, 6610, 6710, 6810, the UFS devices 6520, 6620, 6720, 6820 and the UFS cards 6530, 6630, 6730, 6830 in the respective UFS systems 6500, 6600, 6700, 6800 may communicate with external devices, for example, wired/wireless electronic devices, particularly mobile electronic devices through UFS protocols, and the UFS devices 6520, 6620, 6720, 6820 and the UFS cards 6530, 6630, 6730, 6830 may be embodied by the memory system 110 illustrated in FIG. 1A. For example, in the UFS systems 6500, 6600, 6700, 6800, the UFS devices 6520, 6620, 6720, 6820 may be embodied in the form of the data processing system 6200, the SSD 6300 or the eMMC 6400 described with reference to FIGS. 9 to 11, and the UFS cards 6530, 6630, 6730, 6830 may be embodied in the form of the memory card system 6100 described with reference to FIG. 8.

Furthermore, in the UFS systems 6500, 6600, 6700, 6800, the hosts 6510, 6610, 6710, 6810, the UFS devices 6520, 6620, 6720, 6820 and the UFS cards 6530, 6630, 6730, 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720, 6820 and the UFS cards 6530, 6630, 6730, 6830 may communicate with each other through any of various protocols other than the UFS protocol, for example, an UFDs, a MMC, a SD, a mini-SD, and a micro-SD.

Figure 12:
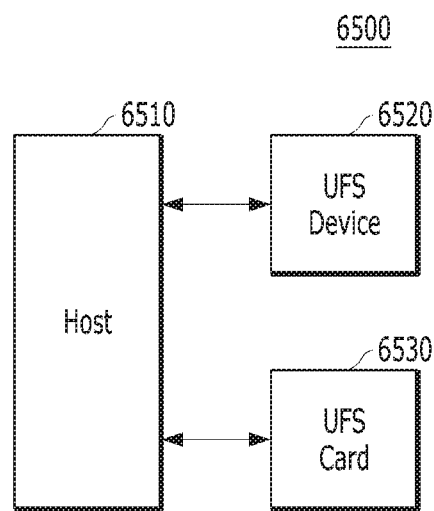

In the UFS system 6500 illustrated in FIG. 12, each of the host 6510, the UFS device 6520 and the UFS card 6530 may include UniPro. The host 6510 may perform a switching operation to communicate with the UFS device 6520 and the UFS card 6530. In particular, the host 6510 may communicate with the UFS device 6520 or the UFS card 6530 through link layer switching, for example, L3 switching at the UniPro. The UFS device 6520 and the UFS card 6530 may communicate with each other through link layer switching at the UniPro of the host 6510. In the illustrated embodiment, one UFS device 6520 and one UFS card 6530 are connected to the host 6510. However, a plurality of UFS devices and UFS cards may be connected in parallel or in the form of a star to the host 6410. A star formation is an arrangement in which a single device is coupled with plural devices for centralized operation. A plurality of UFS cards may be connected in parallel or in the form of a star to the UFS device 6520 or connected in series or in the form of a chain to the UFS device 6520.

Figure 13:
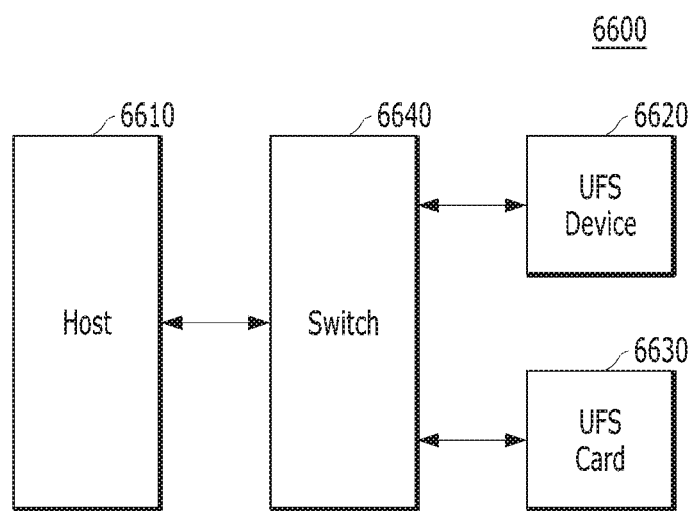

In the UFS system 6600 illustrated in FIG. 13, each of the host 6610, the UFS device 6620 and the UFS card 6630 may include UniPro. The host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the illustrated embodiment, one UFS device 6620 and one UFS card 6630 are connected to the switching module 6640. However, a plurality of UFS devices and UFS cards may be connected in parallel or in the form of a star to the switching module 6640. A plurality of UFS cards may be connected in series or in the form of a chain to the UFS device 6620.

Figure 14:
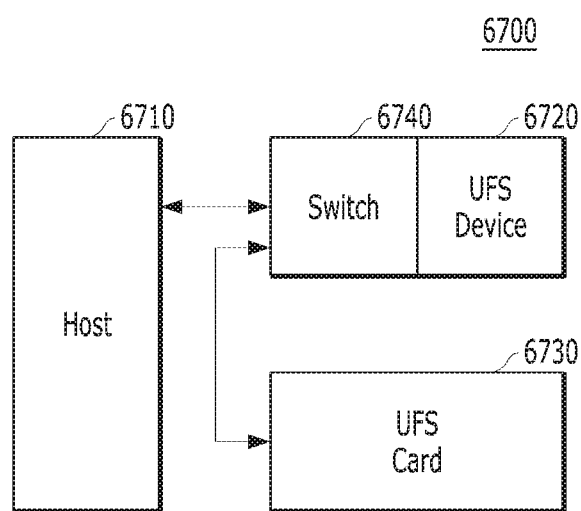

In the UFS system 6700 illustrated in FIG. 14, each of the host 6710, the UFS device 6720 and the UFS card 6730 may include UniPro. The host 6710 may communicate with the UFS device 6720 or the UFS card 6730 through a switching module 6740 performing a switching operation, for example, through the switching module 6740 which performs link layer switching at the UniPro, for example, L3 switching. The UFS device 6720 and the UFS card 6730 may communicate with each other through link layer switching of the switching module 6740 at the UniPro. The switching module 6740 may be integrated as one module with the UFS device 6720 inside or outside the UFS device 6720. In the illustrated embodiment, one UFS device 6720 and one UFS card 6730 are connected to the switching module 6740. However, a plurality of modules, each including the switching module 6740 and the UFS device 6720, may be connected in parallel or in the form of a star to the host 6710. In another example, a plurality of modules may be connected in series or in the form of a chain to each other. Furthermore, a plurality of UFS cards may be connected in parallel or in the form of a star to the UFS device 6720.

Figure 15:
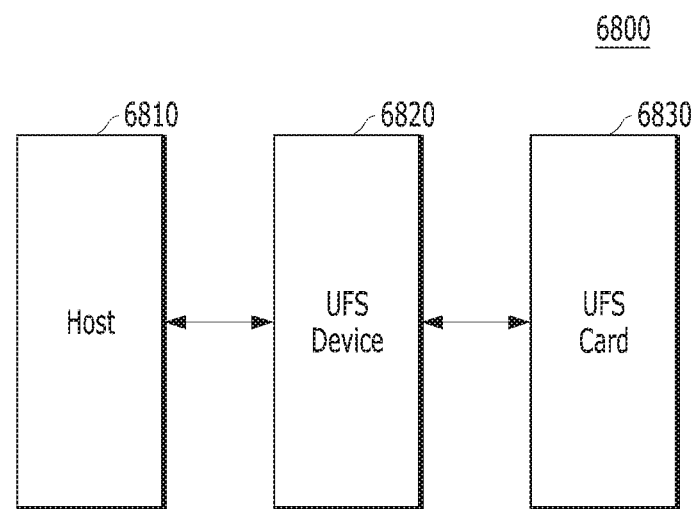

In the UFS system 6800 illustrated in FIG. 15, each of the host 6810, the UFS device 6820 and the UFS card 6830 may include M-PHY and UniPro. The UFS device 6820 may perform a switching operation to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. The host 6810 and the UFS card 6830 may communicate with each other through target ID switching between the M-PHY and UniPro modules of the UFS device 6820. In the illustrated embodiment, one UFS device 6820 is connected to the host 6810 and one UFS card 6830 is connected to the UFS device 6820. However, a plurality of UFS devices may be connected in parallel or in the form of a star to the host 6810, or connected in series or in the form of a chain to the host 6810. A plurality of UFS cards may be connected in parallel or in the form of a star to the UFS device 6820, or connected in series or in the form of a chain to the UFS device 6820.

Figure 16:
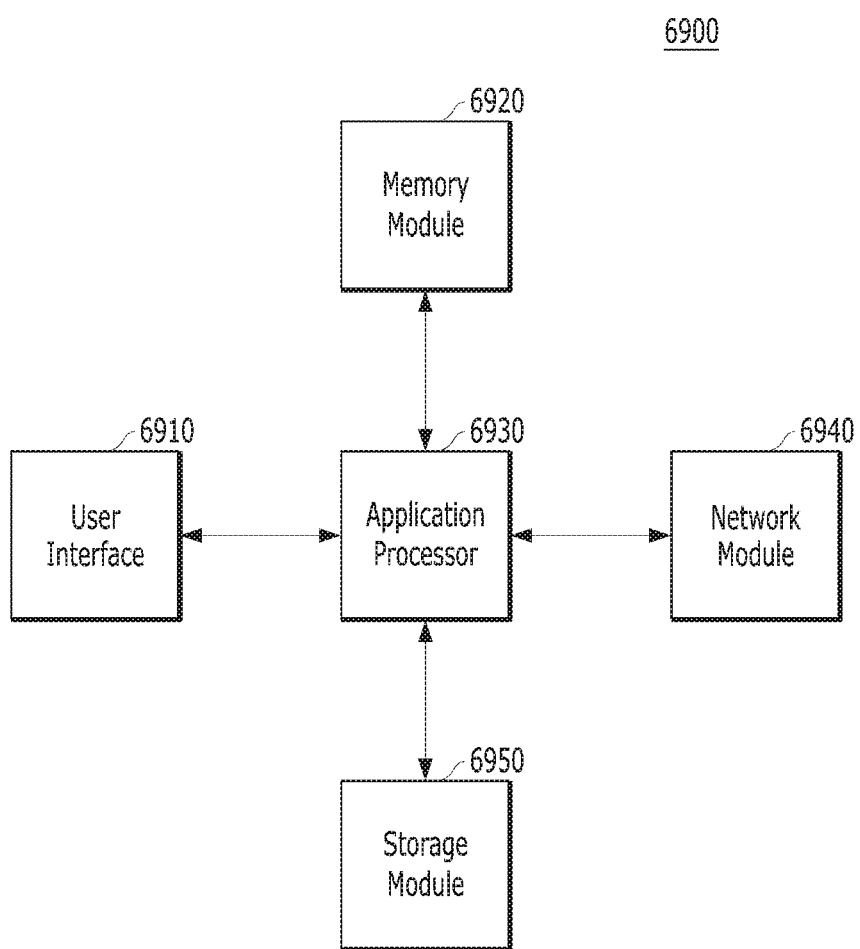

FIG. 16 is a diagram schematically illustrating another example of the data processing system including the memory system in accordance with an embodiment of the present invention. FIG. 16 is a diagram schematically illustrating a user system to which the memory system may be applied.

Referring to FIG. 16, the user system 6900 may include an application processor 6930, a memory module 6920, a network module 6940, a storage module 6950 and a user interface 6910.

Specifically, the application processor 6930 may drive components in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile RAM such as a DRAM, a SDRAM, a DDR SDRAM, a DDR2 SDRAM, a DDR3 SDRAM, a LPDDR SDARM, a LPDDR3 SDRAM or a LPDDR3 SDRAM or a nonvolatile RAM such as a PRAM, a ReRAM, a MRAM or a FRAM. For example, the application processor 6930 and the memory module 6920 may be packaged and mounted, based on POP (Package on Package).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices, particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, a NOR flash and a 3D NAND flash, and provided as a removable storage medium such as a memory card or external drive of the user system 6900. The storage module 6950 may correspond to the memory system 110 described with reference to FIG. 1A. Furthermore, the storage module 6950 may be embodied as an SSD, an eMMC and an UFS as described above with reference to FIGS. 10 to 15.

The user interface 6910 may include interfaces for inputting data or commands to the application processor 6930 or outputting data to an external device. For example, the user interface 6910 is may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1A is applied to a mobile electronic device of the user system 6900, the application processor 6930 may control overall operations of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

In accordance with the present embodiments, the memory system can efficiently program data to the memory device without an additional command.

Although various embodiments have been described for illustrative purposes, it will be apparent to those skilled in the art that various changes and modifications may be made without departing from the spirit and scope of the invention as defined in the following claims.

What is claimed is:

1. A memory system comprising:
   a memory device configured to operate in a normal state or a cache state;
   a controller configured to control the memory device to perform a cache program command in response to a request to a host in the cache state;
   wherein the memory device automatically switches from the cache state to the normal state upon completion of the cache program command.

2. The memory system of claim 1, wherein the cache program command is provided to the memory device when programming sequential data and a normal program command is provided to the memory device when programming non-sequential data.

3. The memory system of claim 2, wherein the memory device performs the cache program command in the cache state and performs the normal program command in the normal state.

4. The memory system of claim 1, wherein the memory device sets a target die to the cache state according to the cache program command.

5. The memory system of claim 2, wherein the memory device includes a write circuit configured to buffer the sequential data and the non-sequential data in one or more page buffers, and programming the sequential and non-sequential data to a target die.

6. The memory system of claim 2, wherein the controller comprises:
a memory configured to store the sequential data and the non-sequential data;
a state manager configured to check operation statuses of a plurality of dies included in the memory device; and
a processor configured to control the memory device.

7. The memory system of claim 6, wherein the controller updates the operation status of a target die to a 'busy' state when an initial operation status of the target die is a 'ready' state and the sequential data is provided to the memory device.

8. The memory system of claim 7, wherein the controller updates the operation status of the target die to the 'ready' state when the program command for the sequential data is completed.

9. The memory system of claim 8, wherein the controller checks that the operation status of the target die is the 'ready' state, and then provides the non-sequential data and the normal program command to the memory device.

10. The memory system of claim 9, wherein the controller updates the operation status of the target die to the 'busy' state when the non-sequential data is provided to the memory device.

11. The memory system of claim 10, wherein the controller updates the operation status of the target die to the 'ready' state when the program command for the non-sequential data is completed.

12. The memory system of claim 11, wherein the controller checks point in time that a cache program command and a normal program command are completed.

13. An operating method for a memory system which processes a cache program command and a normal program command, the operating method comprising:
controlling, by a controller, a memory device to perform a cache program command in response to a request to a host in the cache state,
wherein the memory device is configured to operate in a normal state or a cache state,
wherein the memory device automatically switches from the cache state to the normal state upon completion of the cache program command.

14. The operating method of claim 13, wherein the cache program command is provided to the memory device when programming sequential data and a normal program command is provided to the memory device when programming non-sequential data.

15. The operating method of claim 14, wherein the memory device performs the cache program command in the cache state and performs the normal program command in the normal state.

16. The operating method of claim 13, wherein the memory device sets a target die to the cache state according to the cache program command.

17. The operating method of claim 14, wherein the memory device includes a write circuit configured to buffer the sequential data and the non-sequential data in one or more page buffers, and programming the sequential and non-sequential data to a target die.

18. The operating method of claim 14, wherein the controller comprises:
a memory configured to store the sequential data and the non-sequential data;
a state manager configured to check operation statuses of a plurality of dies included in the memory device; and
a processor configured to control the memory device.

19. The operating method of claim 18, wherein the controller updates the operation status of a target die to a 'busy' state when an initial operation status of the target die is a 'ready' state and the sequential data is provided to the memory device.

20. The operating method of claim 19, wherein the controller updates the operation status of the target die to the 'ready' state when the program command for the sequential data is completed.

21. The operating method of claim 20, wherein the controller checks that the operation status of the target die is the 'ready' state, and then provides the non-sequential data and the normal program command to the memory device.

22. The operating method of claim 21, wherein the controller updates the operation status of the target die to the 'busy' state when the non-sequential data is provided to the memory device.

23. The operating method of claim 22, wherein the controller updates the operation status of the target die to the 'ready' state when the program command for the non-sequential data is completed.

24. The operating method of claim 23, wherein the controller checks point in time that a cache program command and a normal program command are completed.

* * * * *